(12) United States Patent
Ogasawara et al.

(10) Patent No.: US 9,153,849 B2
(45) Date of Patent: Oct. 6, 2015

(54) BUS BAR MODULE

(75) Inventors: Shigeyuki Ogasawara, Makinohara (JP); Michio Ota, Makinohara (JP); Shuichi Nagata, Toyota (JP); Takao Syoji, Makinohara (JP)

(73) Assignees: YAZAKI CORPORATION, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 68 days.

(21) Appl. No.: 13/820,919

(22) PCT Filed: Feb. 9, 2012

(86) PCT No.: PCT/JP2012/053005
§ 371 (c)(1),
(2), (4) Date: Mar. 5, 2013

(87) PCT Pub. No.: WO2012/108514
PCT Pub. Date: Aug. 16, 2012

(65) Prior Publication Data
US 2013/0171495 A1 Jul. 4, 2013

(30) Foreign Application Priority Data
Feb. 9, 2011 (JP) .................. 2011-025694

(51) Int. Cl.
H01M 2/10 (2006.01)
H01M 2/24 (2006.01)
H01M 10/48 (2006.01)
H01M 2/04 (2006.01)
H01M 2/20 (2006.01)
(Continued)

(52) U.S. Cl.
CPC .......... *H01M 10/482* (2013.01); *H01M 2/1077* (2013.01); *H01M 2/206* (2013.01); *G01R 31/3696* (2013.01); *H01M 10/4207* (2013.01); *H01M 2010/4271* (2013.01)

(58) Field of Classification Search
CPC .................... H01M 2/02–2/0247; H01M 2/04; H01M 2/043–2/0439; H01M 2/22–2/24
See application file for complete search history.

(56) References Cited

U.S. PATENT DOCUMENTS 5,643,693 A * 7/1997 Hill et al. ...................... 429/121
2002/0086578 A1 7/2002 Ikeda
(Continued)

FOREIGN PATENT DOCUMENTS

CN 101950989 A 1/2011
EP 2187465 A1 5/2010
(Continued)

OTHER PUBLICATIONS

International Search Report for PCT/JP2012/053005, dated Mar. 13, 2012 [PCT/ISA/210].
(Continued)

*Primary Examiner* — Jonathan Crepeau
*Assistant Examiner* — Jacob Buchanan
(74) *Attorney, Agent, or Firm* — Sughrue Mion, PLLC

(57) ABSTRACT

A drawing section 35 for electric wires 17 is formed such that a bottom plate 37 and a side wall 39 of a wiring path 21 are extended to be projected from an insulating plate 23. A tongue piece 43 around which a tape is wound together with the wires 17, is formed on the drawing section 35. The tongue piece 43 is bent in a direction opposite to a rising direction of the side wall 39 of the drawing section 35 so that a projection dimension of the tongue piece 43 is reduced.

7 Claims, 5 Drawing Sheets

(51) Int. Cl.
*G01R 31/36* (2006.01)
*H01M 10/42* (2006.01)

(56) References Cited

U.S. PATENT DOCUMENTS

| | | | |
|---|---|---|---|
| 2002/0098734 A1* | 7/2002 | Ikeda | 439/500 |
| 2008/0118819 A1* | 5/2008 | Gamboa et al. | 429/61 |
| 2010/0124693 A1 | 5/2010 | Kosugi et al. | |
| 2010/0271036 A1 | 10/2010 | Kishimoto et al. | |
| 2010/0330412 A1* | 12/2010 | Park | 429/163 |
| 2011/0008669 A1 | 1/2011 | Ogasawara et al. | |
| 2011/0064986 A1 | 3/2011 | Ogasawara et al. | |

FOREIGN PATENT DOCUMENTS

| | | |
|---|---|---|
| JP | 2010-170884 A | 8/2010 |
| JP | 2010-257750 A | 11/2010 |
| JP | 2011-018499 A | 1/2011 |
| JP | 2011-067012 A | 3/2011 |
| JP | 2011-077031 A | 4/2011 |
| WO | 2011/027917 A1 | 3/2011 |

OTHER PUBLICATIONS

Written Opinion for PCT/JP2012/053005, dated Mar. 13, 2012 [PCT/ISA/237].

Preliminary Report on Patentability dated Aug. 22, 2013, issued by the International Searching Authority in counterpart International Application No. PCT/JP2012/053005.

Office Action dated Dec. 17, 2014, issued by the State Intellectual Property Office in P.R. China in counterpart Chinese Application No. 201280004029.6.

Extended European Search Report issued Sep. 5, 2014; by the EPO in related Application No. 12744680.5.

\* cited by examiner

BUS BAR MODULE

TECHNICAL FIELD

The present invention relates to a bus bar module that connects a plurality of batteries in series and, more particularly, to a technique of fixing an electric wire connected to a voltage detection terminal which is adapted to detect a voltage of each of the batteries.

BACKGROUND ART

Patent Document 1 proposes that a power source device having a plurality of batteries connected in series is used as a driving source of an electric motor of a hybrid car or an electric vehicle.

The power source device described in the Patent Document 1 is formed such that a bus bar module is attached to the plurality of batteries which are collected so that positive electrodes and negative electrodes are alternately arranged. The bus bar module described in the Patent Document 1 includes a plurality of bus bars that respectively connect positive electrodes and negative electrodes of the adjacent batteries to each other, a plurality of voltage detection terminals that are respectively attached to the bus bars and are adapted to detect voltages of the respective batteries, a plurality of electric wires connected to the respective voltage detection terminals, and a resin plate on which a first storage section that accommodates the bus bars and a watershoot shaped second storage section that accommodates the electric wires are formed.

The electric wires are drawn from a drawing section which is projected from the plate such that a bottom plate and a side wall of the second storage section adapted to accommodate the electric wires are extended. A tongue piece projected from a tip portion of the bottom plate of the drawing section and the drawn electric wires are wound together by a winding member such as a tape or the like so that the electric wires are bundled together on the tongue piece to be fixed thereto.

PRIOR ART DOCUMENTS

Patent Documents

Patent Document 1: JP-A-2010-170884

SUMMARY OF INVENTION

Problems that the Invention is to Solve

Meanwhile, it is discussed that the power source device disclosed in the above described Patent Document 1 is accommodated in a protection case, and thereby it is mounted in a hybrid car or an electric vehicle. At that time, in a case where the tongue piece to which the electric wires are fixed is long, a problem may arise that the size of the protection case is made to be increased by an amount corresponding to the length so that a placement space of the power source device is enlarged. On the other hand, it can be thought that the length of the tongue piece is reduced. However, it is not possible to make the length of the tongue piece to be less than the size of the winding member. Further, in a case where the length of the tongue piece is reduced, it is hard to wind the winding member around the tongue piece so that a problem may arise that an operational efficiency of winding is lowered.

The purpose of the invention is to achieve a bus bar module which can allow a placement space of a power source device to be reduced without lowering an operational efficiency.

Means for Solving the Problems

The above problems can be solved by the following aspects of the invention.

(1) A bus bar module includes a plurality of bus bars each of which connects adjacent positive electrode and negative electrode of a plurality of batteries to each other so as to connect the plurality of batteries in series, the plurality of batteries being placed such that the positive electrodes and the negative electrodes are alternately arranged, a plurality of voltage detection terminals that are respectively connected to the bus bars, a plurality of electric wires that are respectively connected to the voltage detection terminals, and an insulating plate on which a fixing section adapted to fix the bus bars and a wiring path adapted to accommodate the electric wires are formed. The insulating plate includes a drawing section for the electric wires which is formed such that a bottom plate and a side wall of the wiring path are extended and projected from the insulating plate, and a tongue piece which is projected from a bottom plate of the drawing section. A winding member is wound around the tongue piece and the plurality of electric wires so as to bundle the electric wires together on the tongue piece to fix them to the tongue piece. The tongue piece is bent in a direction opposite to a rising direction of a side wall of the drawing section.

In accordance with the bus bar module having the configuration of the aspect (1), by bending the projected tongue piece to deform it, a projection dimension of the tongue piece can be reduced without changing the length of the tongue piece. Therefore, a protection case can be reduced in size without lowering an operational efficiency of winding and a placement space of a power source device can be reduced. Meanwhile, it is preferable to form the tongue piece from a resin or the like having a plasticity.

(2) The bus bar module having the configuration of the aspect (1), is configured such that the tongue piece is projected from the bottom plate at an innermost portion of a cut-in portion which is formed by cutting the bottom plate of the drawing section toward the insulating plate side.

In accordance with the bus bar module having the configuration of the aspect (2), since the tongue piece can be made to be in close proximity to a battery side by a distance corresponding to the cut-in portion formed on the bottom plate of the drawing section, it is possible to reduce more the projection dimension of the tongue piece projected from the battery. At that time, since the length of the tongue piece is not changed, a space for winding the winding member can be retained and the operational efficiency of winding can be maintained.

(3) In the bus bar module having the configuration of the aspect (2), a base section of the tongue piece includes a thinned portion where the thickness is reduced to lower its rigidity.

In accordance with the bus bar module having the configuration of the aspect (3), in a case where the thickness of the base section of the tongue piece is reduced so as to form the thinned portion and to lower the rigidity of the base section, the tongue piece can be bent at the base section thereof when the tongue piece is to be bent. Therefore, the bent portion of the tongue piece can be brought into close proximity to the battery side and the protection case can be reduced in size. In addition, since the tongue piece becomes liable to be bent, it is possible to improve an operational efficiency of a bending operation. Meanwhile, as a structure of the thinned portion of which the rigidity is lowered by thinning the base section of the tongue piece, a plate thickness of the base section is reduced or a width of the base section is reduced, thus the way can be selected on an as-needed basis.

MODE FOR CARRYING OUT THE INVENTION

An embodiment of the invention is described below. Meanwhile, in order to ease the explanation, a power source device in which a plurality of batteries are connected in series by means of a bus bar module according to the embodiment is described first, and then the bus bar module according to the embodiment is described.

Figure 1:
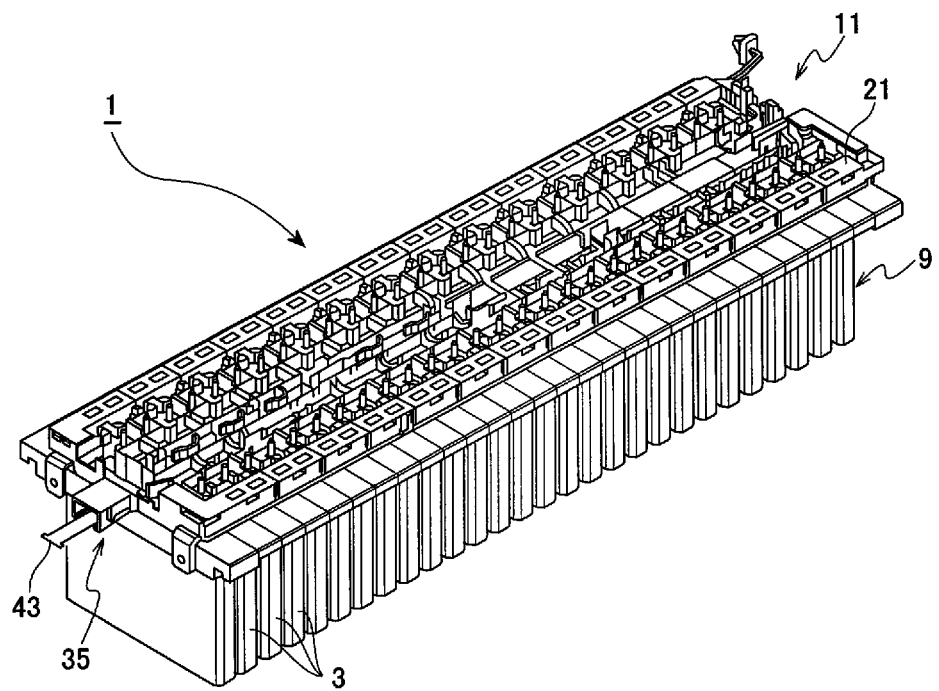
FIG. 1 is a perspective view showing a state in which a plurality of batteries are connected in series by means of a bus bar module according to a first embodiment of the invention.

As shown in FIG. 1, the power source device 1 includes a plurality of batteries 3 (28 in the embodiment), and the bus bar module 11 that connects the batteries 3 in series. Each of the batteries 3 is, for example, a rectangular solid secondary battery, and a positive electrode 5 and a negative electrode 7 in circular column shapes are provided to be projected on an identical face of each of the batteries 3.

Figure 2:
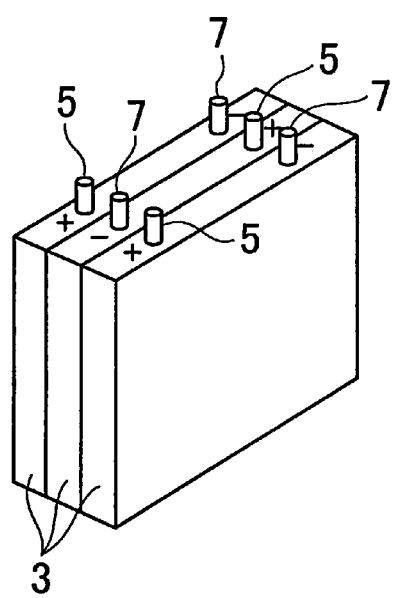
FIG. 2 is a perspective view showing an arrangement state of the batteries shown in FIG. 1.

As shown in FIG. 2, the plurality of batteries 3 are aligned such that the positive electrodes 5 and the negative electrodes 7 are alternately arranged, and thereby a battery assembly 9 is formed. Thus, the bus bar module 11 is attached to the battery assembly 9 in which the plurality of batteries 3 are aligned, and thereby the batteries 3 are connected in series.

Figure 3:
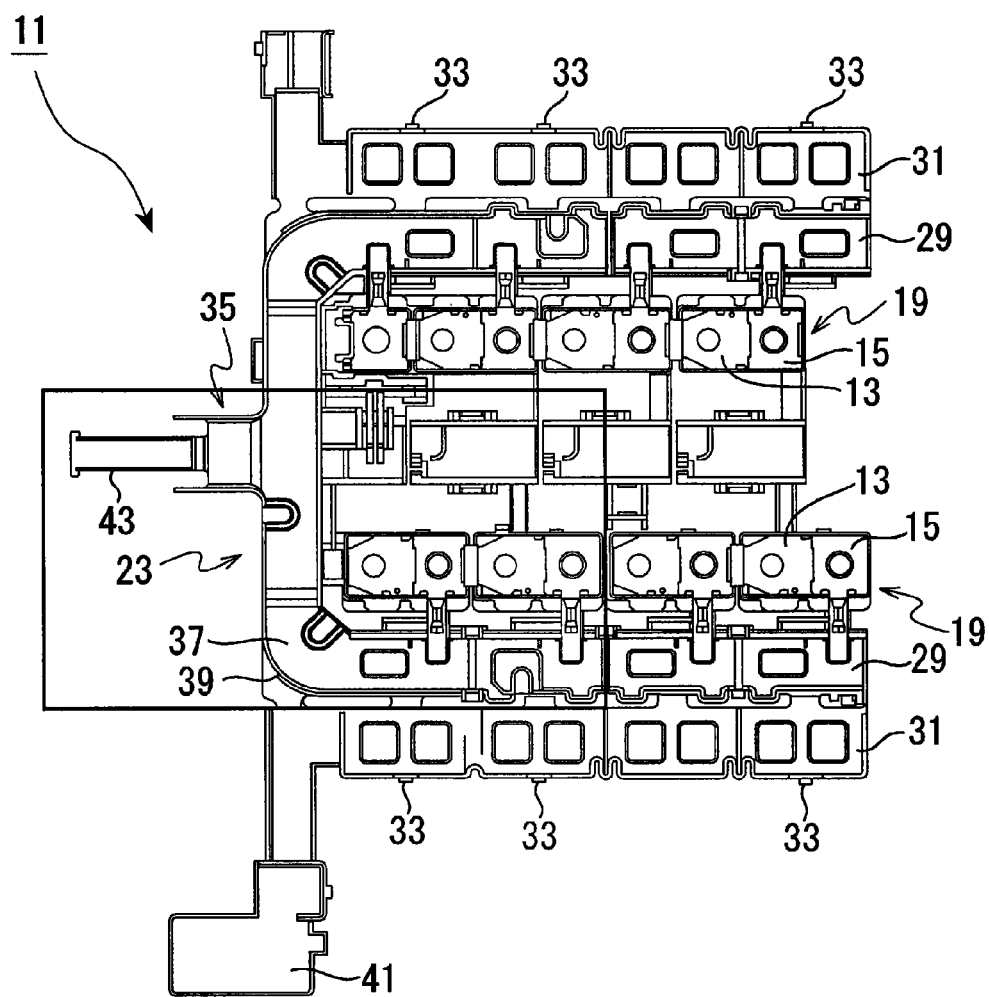
FIG. 3 is a plan view showing a main part of the bus bar module shown in FIG. 1.
Figure 4:
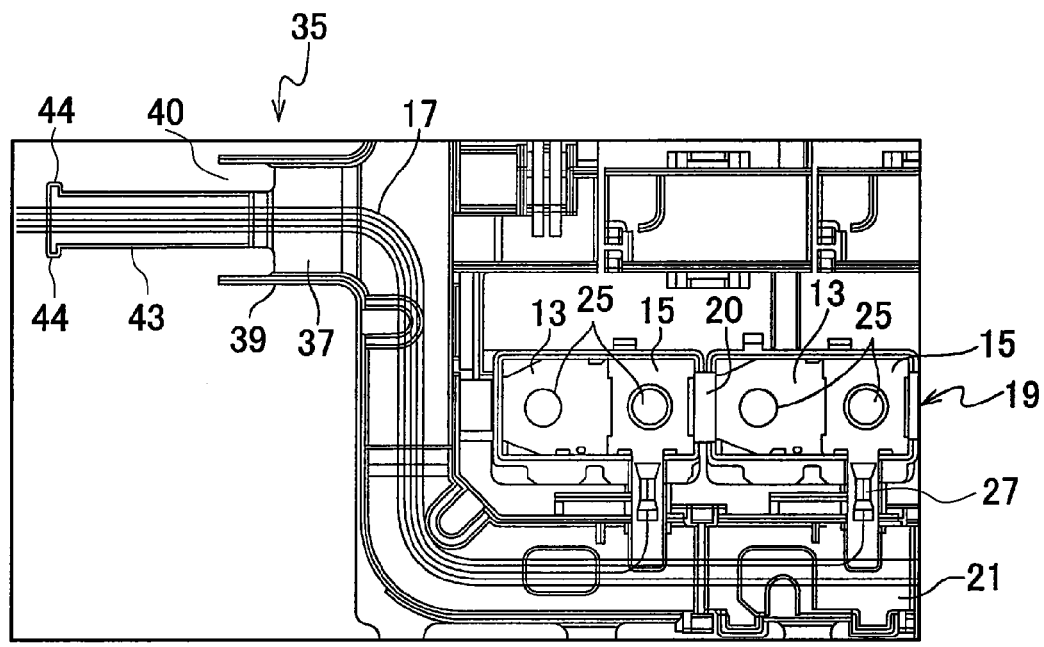
FIG. 4 is an enlarged view showing a region enclosed by a square shown in FIG. 3.
Figure 5:
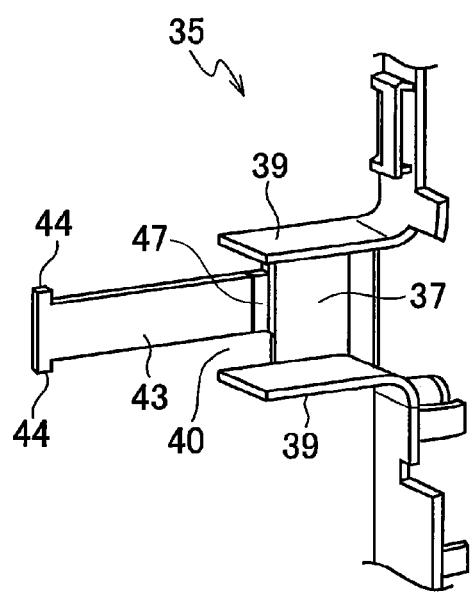
FIG. 5 is an enlarged view showing a drawing section for electric wires shown in FIG. 3.

As shown in FIGS. 3 to 5, the bus bar module 11 according to the embodiment includes a plurality of bus bars 13 which respectively connect the positive electrodes 5 and the negative electrodes 7 in adjacent batteries, a plurality of voltage detection terminals 15 respectively connected to the bus bars 13, a plurality of electric wires 17 respectively connected to the voltage detections terminals 15, an insulating plate 23 on which fixing sections 19 that respectively accommodate and fix the bus bars 13 and a wiring path that accommodates the electric wires 17 are formed.

Each of the bus bars 13 is formed of a conductive unit, for example, a copper-made plate member, and has a pair of holes 25 into which the positive electrode 5 and the negative electrode 7 of the batteries 3 are respectively inserted. With this, by inserting the positive electrode 5 and the negative electrode 7 into the holes 25 and causing nuts (not shown) to be screw-engaged therewith, the bus bars 13 can be fixed to the positive electrodes 5 and the negative electrodes 7 and can be connected thereto.

As shown in FIG. 4, the voltage detection terminals 15 each formed of a conductive unit, for example, a copper-made plate member can be respectively superimposed on the bus bars 13 at one-hole 25 sides. Each of the voltage detection terminals 15 includes a crimping section 27, and the electric wire 17 of which the core wire is exposed by peeling its insulating coating is connected to the voltage detection terminal 15. The electric wires 17 are connected to a voltage detector (not shown), and thereby a voltage of each of the batteries 3 can be detected.

The insulating plate 23 is formed of, for example, a plate member made of a resin and includes a plurality of holes into which the positive electrodes 5 and the negative electrodes 7 of the battery assembly 9 are respectively inserted. The insulating plate 23 is formed in a size corresponding to a face of the battery assembly 9 on which electrodes are provided to be projected. Each of the fixing sections 19 of the insulating plate 23 is formed in a groove having a U-shaped cross section, and thereby the bus bars 13 which are respectively accommodated in the grooves and placed on the bottom face and the voltage detection terminals 15 superimposed on the respective bus bars 13 can be fixed by means of engagement members (not shown). An insulating section 20 made of a resin which insulates the adjacent bus bars 13 from each other is provided between the adjacent fixing sections 19.

The wiring path 21 of the insulating plate 23 is formed in a cylindrical shape in such a manner that, for example, an upper face opening of the groove 29 having the U-shaped cross section is covered with a lid 31. Engagement projections 33 which are engaged with and fixed to engagement portions provided on the groove 29, are provided on an edge of the lid 31. With this, after the electric wires 17 are accommodated in the groove of the wiring path 21, the lid 31 is folded toward the groove 29 and the engagement projections 33 are engaged with the engagement portions provided on the edge of the groove 29, and thereby the cylindrical shaped wiring path 21 can be formed. The wiring path 21 formed as in the above, is formed at each of both side edges of the insulating plate 23 along the longitudinal direction of the insulating plate 23.

The wiring path 21 includes a drawing section 35 which is adapted to draw the electric wires 17 from the wiring path 21. The drawing section 35 is formed in a cylindrical shape by a groove having a U-shaped cross section which is formed such that, for example, a bottom plate 37 and a side wall 39 of the wiring path 21 are extended to be projected from the insulating plate 23, and a lid 41 which closes an upper face opening of the groove. The lid 41 is formed to be continuous to the lid 31 of the wiring path 21, and is able to be folded together with the lid 31 of the wiring path 21.

A cut-in portion 40 extending toward the insulating plate 23 is formed on the bottom plate 37 of the drawing section 35. A tip portion of the bottom plate 37 is provided with a plate-shaped tongue piece 43 which is projected from the bottom plate 37. The tongue piece 43 is configured such that a winding member, for example, a tape 45 is wound around the plurality of electric wires 17 drawn from the drawing section 35 so that the electric wires 17 can be bundled together on the tongue piece 43 and fixed thereto. A tip portion of the tongue piece 43 is provided with a pair of projections 44 protruding in a direction perpendicular to a projection direction of the tongue piece 43. The projections 44 prevent the tape 45 from coming off in the projection direction of the tongue piece 43 when the tape 45 is wound around the tongue piece 43. Meanwhile, in the embodiment, the insulating plate 23, the drawing section 35 and the tongue piece 43 are integrally molded from the same resin.

In the embodiment, the tongue piece 43 of the bus bar module 11 is formed of, for example, a resin having a flexibility, and thereby it is able to be bent. The tongue piece 43 is formed such that it is projected from the tip portion of the bottom plate 37 of the cut-in portion 40 at the innermost portion, the cut-in portion 40 being formed by cutting the bottom plate 37 of the drawing section 35 toward the insulating plate 23 side. In addition, a base section of the tongue piece 43 includes a thinned portion 47 of which the plate thickness is reduced rather than those of the other portions so as to cause it to be thinned.

An assembling operation of the bus bar module 11 formed as in the above, is described below.

First, the bus bars 13 are accommodated in and fixed to the respective fixing sections 19 of the insulating plate 23.

Next, the voltage detection terminals 15 to which the electric wires 17 are respectively crimped in advance, are superimposed on the respective bus bars 13 and are fixed to the respective fixing sections 19.

Then, the electric wires 17 connected to the respective voltage detection terminals 15 are accommodated in the groove 29 of the wiring path 21 to be arrayed therein, and the electric wires 17 are drawn from the drawing section 35 to the outside of the wiring path 21. After drawing the electric wires 17, the lid 31 is fixed to the groove 29 of the wiring path 21. At that time, the lid 41 of the drawing section 35 which is integrally formed with the lid 31 is also fixed to the drawing section 35. With the above operations, the wiring path 21 and the drawing section 35 are formed in the cylindrical shapes, and the plurality of electric wires 17 are wired in the cylindrical shaped sections.

Next, an action of the bus bar module 11 according to the embodiment is described below along with the operation of fixing the electric wires 17 to the tongue piece 43.

Figure 6:
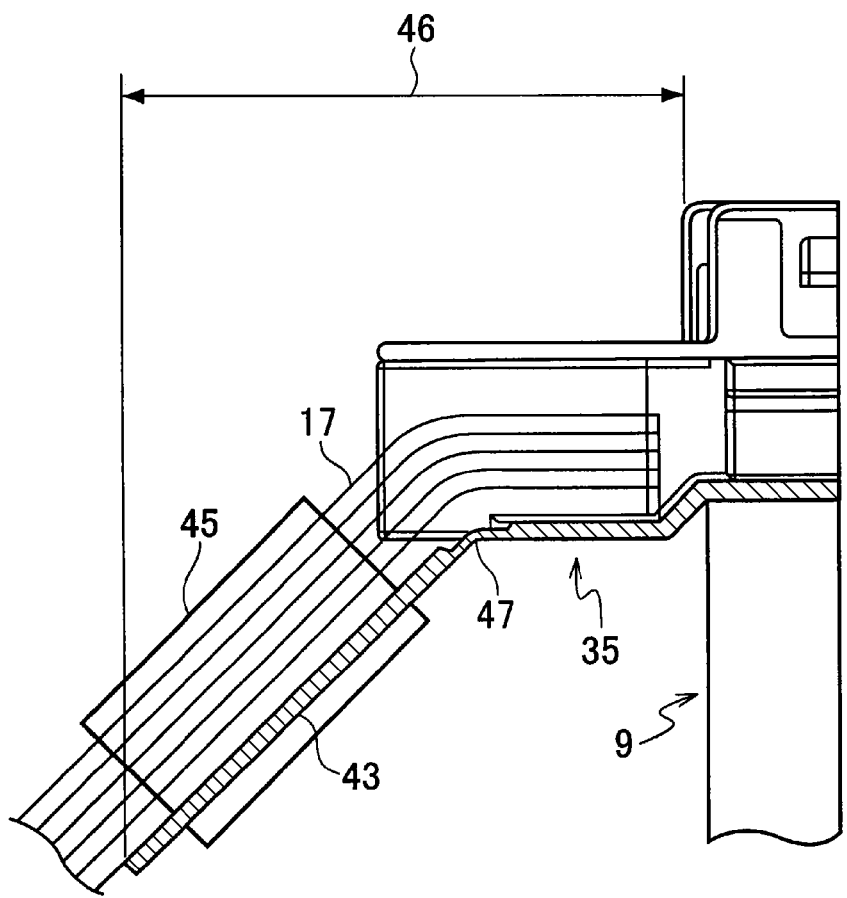
FIG. 6 is a vertical cross sectional view showing the drawing section to which the electric wires are fixed.
Figure 7:
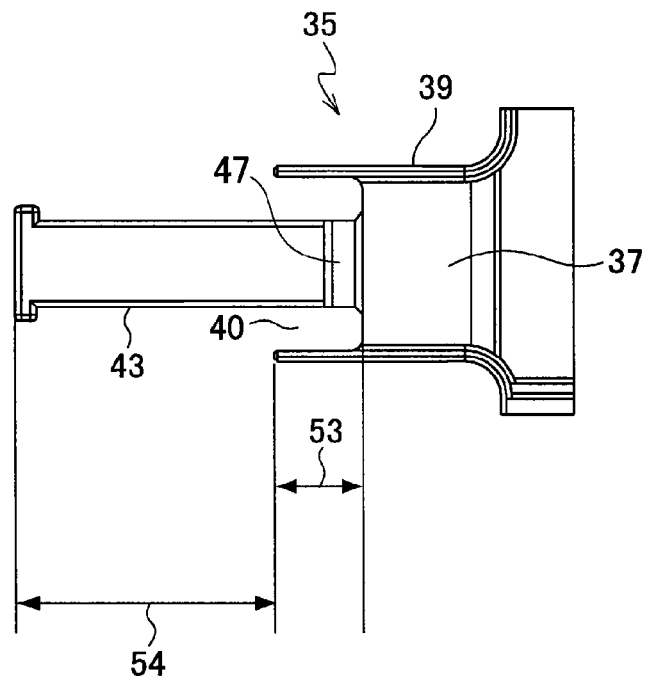
FIG. 7 is a plan view showing an action of a cut-in portion formed on a bottom plate of the drawing section.

The plurality of electric wires 17 drawn from the drawing section 35 are bundled together at a position of the tongue piece 43. Under this condition, as shown in FIG. 6, the tongue piece 43 is bent in a direction opposite to a rising direction of the side wall 39 of the drawing section 35 (toward a battery assembly 9 side) at a position of the thinned portion 47, the tape 45 is wound around the tongue piece 43 together with the bunch of electric wires 17 so as to cause the bunch of the electric wires 17 to be fixed to the tongue piece 43. At that time, since the tongue piece 43 is formed of a resin having a plasticity, the tongue piece 43 is deformed in the bending direction. In addition, as shown in FIG. 7, the tongue piece 43 is positioned in the drawing section 35 to be inner side by a distance corresponding to a dimension 53 of the cut-in portion 40, and thereby a dimension 54 of a part of the tongue piece 43 protruding from the drawing section 35 is reduced.

In accordance with the bus bar module 11 of the embodiment, since the tongue piece 43 is bent toward the battery assembly 9 side and the part of the tongue piece 43 is formed in the drawing section 35, a projection dimension 46 of the power source device 1 can be reduced and a protection case which accommodates the power source device 1 can be reduced in size. That is, in a case where the power source device 1 is mounted on a hybrid car or an electric vehicle, the power source device 1 is accommodated in a protection case which is formed by combining metallic plates along an outer shape of the power source device 1. Since a placement space of the power source device 1 is determined by an outer dimension of the protection case, it is desirable to reduce the protection case in size.

In the embodiment, the protection case is made to be large by an amount corresponding to the projection dimension 46 of the battery assembly 9. However, by reducing the projection dimension 46, the outer dimension of the protection case can be reduced by its amount so that the placement space of the power source device 1 can be reduced. Further, since the projection dimension 46 can be reduced without changing the length of the tongue piece 43, it is possible to prevent lowering of the operational efficiency of winding the tape 45 around the bunch of the electric wires 17 and the tongue piece 43.

Meanwhile, in the embodiment, when the power source device 1 is accommodated in the protection case, an insulating material is disposed between the power source device 1 and an inner face of the protection case so as to insulate the protection case and the power source device 1 from each other. In addition, the protection case includes a connector or the like which connects the drawing section adapted to draw the electric wires connected to the power source device 1 or the power source device 1 to an external device.

Figure 8:
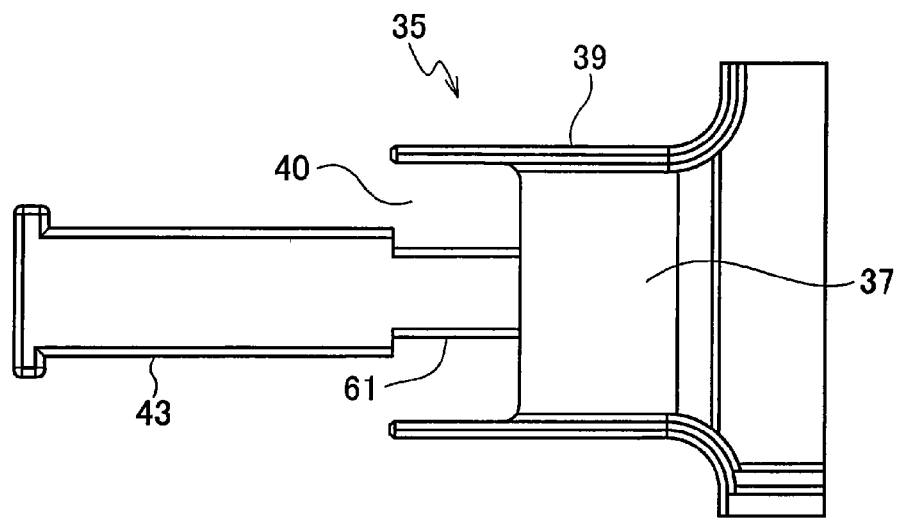
FIG. 8 is a plan view showing a modified example of a thinned portion of a tongue piece.

Further, in the embodiment, the plate thickness of the base section of the tongue piece 43 is reduced so as to form the thinned portion 47 as a bent portion. However, as shown in FIG. 8, it is possible that a width of the base section of the tongue piece 43 is reduced to be thinned so as to form a thinned portion 61.

Moreover, in a case where the lid 41 of the drawing section 35 is omitted and the electric wires 17 are exposed at the drawing section 35 so that the electric wires 17 are possibly damaged, it is preferable that the lid 41 is provided.

Moreover, in the embodiment, while the cut-in portion 40 is provided on the bottom plate 37 of the drawing section 35, it is possible that the cut-in portion 40 is not provided and the projection dimensions of the bottom plate 37 and the side wall 39 are made to be the same.

Moreover, the winding member is not limited to the tape 45, and it is possible that a band is wound around the electric wires 17 and the tongue piece 43 so as to bundle the electric wires 17 together and to fix them.

Meanwhile, the invention is not limited to the above embodiment, but changes, modifications or the like can be made if necessary. Other than that, a material, a shape and a dimension of each component, the number of components, a placement position of each component and the like in the above embodiment are arbitrary as long as the invention can be achieved so that they are not limited.

In addition, this application is based on Japanese Patent Application (JP-2011-025694) filed on Feb. 9, 2011, the contents of which are incorporated herein by reference.

INDUSTRIAL APPLICABILITY

In accordance with the bus bar module of the invention, it is possible to reduce the placement space of the power source device without lowering the operational efficiency.

DESCRIPTION OF REFERENCE NUMERALS AND SIGNS 3 battery
5 positive electrode
7 negative electrode
11 bus bar module
13 bus bar
15 voltage detection terminal
17 electric wire
19 fixing section
21 wiring path
23 insulating plate
35 drawing section
37 bottom plate
39 side wall
40 cut-in portion
43 tongue piece
45 tape (winding member)
47 thinned portion

The invention claimed is:

1. A bus bar module comprising:
a plurality of bus bars each of which connects adjacent positive electrode and negative electrode of a plurality of batteries to each other so as to connect the plurality of batteries in series, the plurality of batteries being arranged so that the positive electrodes and the negative electrodes are alternately arranged;
a plurality of voltage detection terminals that are respectively connected to the bus bars;
a plurality of electric wires that are respectively connected to the voltage detection terminals; and
an insulating plate on which a fixing section adapted to fix the bus bars and a wiring path adapted to accommodate the electric wires are formed,
wherein the insulating plate includes a drawing section for the electric wires which is formed so that a bottom plate and a side wall of the wiring path are extended and projected from the insulating plate, and a tongue piece which is projected from a tip portion of a bottom plate of the drawing section;
wherein a winding member is wound around the tongue piece and the plurality of electric wires so as to bundle the electric wires together on the tongue piece to fix the electric wires to the tongue piece;
wherein the tongue piece is bent in a direction opposite to a rising direction of a side wall of the drawing section
wherein an end portion of the side wall is projected further than the tip portion of the bottom plate of the drawing section where the tongue piece is projected, in an extending direction of the electric wires around which the winding member is wound;
wherein the side wall includes a pair of sidewalls which face each other; and
wherein the pair of sidewalls extend from the bottom plate of the drawing section in a direction perpendicular to the bottom plate of the drawing section.

2. The bus bar module according to claim 1, wherein the tongue piece is projected from the bottom plate of the drawing section at an innermost portion of a cut-in portion which is formed by cutting the bottom plate of the drawing section toward the insulating plate side.

3. The bus bar module according to claim 2, wherein a base section of the tongue piece includes a thinned portion where the thickness is reduced to lower its rigidity.

4. The bus bar module according to claim 1, further comprising:
a battery assembly formed by arrangement of the plurality of batteries,
wherein the tongue piece is bent in a direction toward a side of the battery assembly.

5. The bus bar module according to claim 1, further comprising:
a case configured to house the bus bar module,
wherein the tongue piece bends if a projection dimension of the bus bar module is larger than a size of the case.

6. The bus bar module according to claim 1, wherein an end of the tongue piece distal from the drawing section moves from a first position to a second position when the tongue piece is bent.

7. The bus bar module according to claim 1, wherein a base section of the tongue piece includes a thinned portion whose width is smaller than a width of a section of the tongue piece other than the base section.

* * * * *